(12) United States Patent
Zahn

(10) Patent No.: US 6,657,475 B1
(45) Date of Patent: Dec. 2, 2003

(54) DC VOLTAGE BUS CLAMP

(76) Inventor: David L. Zahn, 4133 Courtney St., #5, Franksville, WI (US) 53426

( * ) Notice: Subject to any disclaimer, the term of this patent is extended or adjusted under 35 U.S.C. 154(b) by 72 days.

(21) Appl. No.: 10/175,606

(22) Filed: Jun. 18, 2002

(51) Int. Cl.[7] .................................................. H03K 5/08
(52) U.S. Cl. ....................................... 327/309; 327/321
(58) Field of Search ................................. 327/309, 310, 327/313, 314, 315, 318–322, 327, 328, 331, 332, 312

(56) References Cited

U.S. PATENT DOCUMENTS

| | | | | |
|---|---|---|---|---|
| 4,186,418 A | * | 1/1980 | Seiler ........................ 361/91.6 |
| 5,138,192 A | * | 8/1992 | Hsu ............................ 327/309 |
| 5,861,738 A | | 1/1999 | Becker-Irvin et al. ...... 323/282 |
| 6,064,249 A | * | 5/2000 | Duvvury et al. ............ 327/314 |
| 6,097,235 A | * | 8/2000 | Hsu et al. .................... 327/314 |
| 6,169,439 B1 | * | 1/2001 | Teggatz et al. ............. 327/318 |
| 6,445,239 B1 | * | 9/2002 | Zierhut ........................ 327/313 |

\* cited by examiner

*Primary Examiner*—Toan Tran

(57) ABSTRACT

A DC voltage bus clamp includes a transistor, a resistor, and a diode. The transistor is placed in parallel with a load. The resistor is connected across a bridge rectifier. A gate or base of the transistor is connected to the resistor. The anode of the diode is connected to ground and the cathode is connected to the gate or base of the transistor. A hysteresis circuit may be added to form a second embodiment of the DC voltage bus clamp to trigger the transistor suddenly. A third embodiment of the DC voltage bus clamp includes a resistor sensing circuit. The diode of the first embodiment is replaced with a sense resistor. The resistor sensing circuit is connected between the sense resistor and the transistor.

18 Claims, 6 Drawing Sheets

DC VOLTAGE BUS CLAMP

BACKGROUND OF THE INVENTION

1. Field of the Invention

The present invention relates generally to voltage clamps and more specifically to a DC voltage bus clamp that provides protection from electrical current released from a load.

2. Discussion of the Prior Art

A load such as a DC motor will release electrical current when slowed or stopped. The electrical current released from the load may damage a power supply such as a rectified AC source or a DC source through a DC voltage bus. It appears that only complicated solutions exist for protecting the power source from damage due to reverse current.

Accordingly, there is a clearly felt need in the art for a DC voltage bus clamp that provides protection from electrical current released from a load without undue complexity.

SUMMARY OF THE INVENTION

The present invention provides a DC voltage bus clamp that provides protection from electrical current released from a load. The DC voltage bus clamp includes a transistor, a bleed resistor, and a pull-down diode. The transistor is placed in parallel with the load. If the power source supplies AC voltage, a filter capacitor is placed in parallel with the load. One end of the bleed resistor is connected to a positive terminal of the load and the other end of the bleed resistor is connected to a cathode of the pull-down diode. A gate or base of the transistor is connected to the other end of the bleed resistor. An anode of the pull-down diode is connected to ground and the cathode is connected to the gate or base of the transistor. A power resistor may be connected between the load and the transistor to help dissipate the electrical current discharged from the load. In a second embodiment of the DC voltage bus clamp, a hysteresis circuit is added to the DC voltage bus clamp to trigger the transistor suddenly. The hysteresis circuit includes a pull down transistor with a gate or base that is supplied with reverse electrical current from a slowed or stopped load. Capacitive and inductive filtering may be added to DC voltage bus clamp to prevent false triggering of the transistor.

A third embodiment of the DC voltage bus clamp includes the transistor, a resistor sensing circuit, the bleed resistor, and a sense resistor. The transistor is placed in parallel with the load. If the power source supplies AC voltage, a filter capacitor is placed in parallel with the bleed resistor. One end of the bleed resistor is connected to a positive terminal of the load. One end of the sense resistor is connected to ground and the other end is connected to the other end of the bleed resistor. The resistor sensing circuit is connected between the other end of the sense resistor and the gate or base of the transistor. A power resistor may be added between the load and the transistor to help dissipate the electrical current discharged when the load is slowed or stopped.

Accordingly, it is an object of the present invention to provide a DC voltage bus clamp that provides protection from electrical current released from a load without undue complexity.

These and additional objects, advantages, features and benefits of the present invention will become apparent from the following specification.

DETAILED DESCRIPTION OF THE PREFERRED EMBODIMENTS

Figure 1:
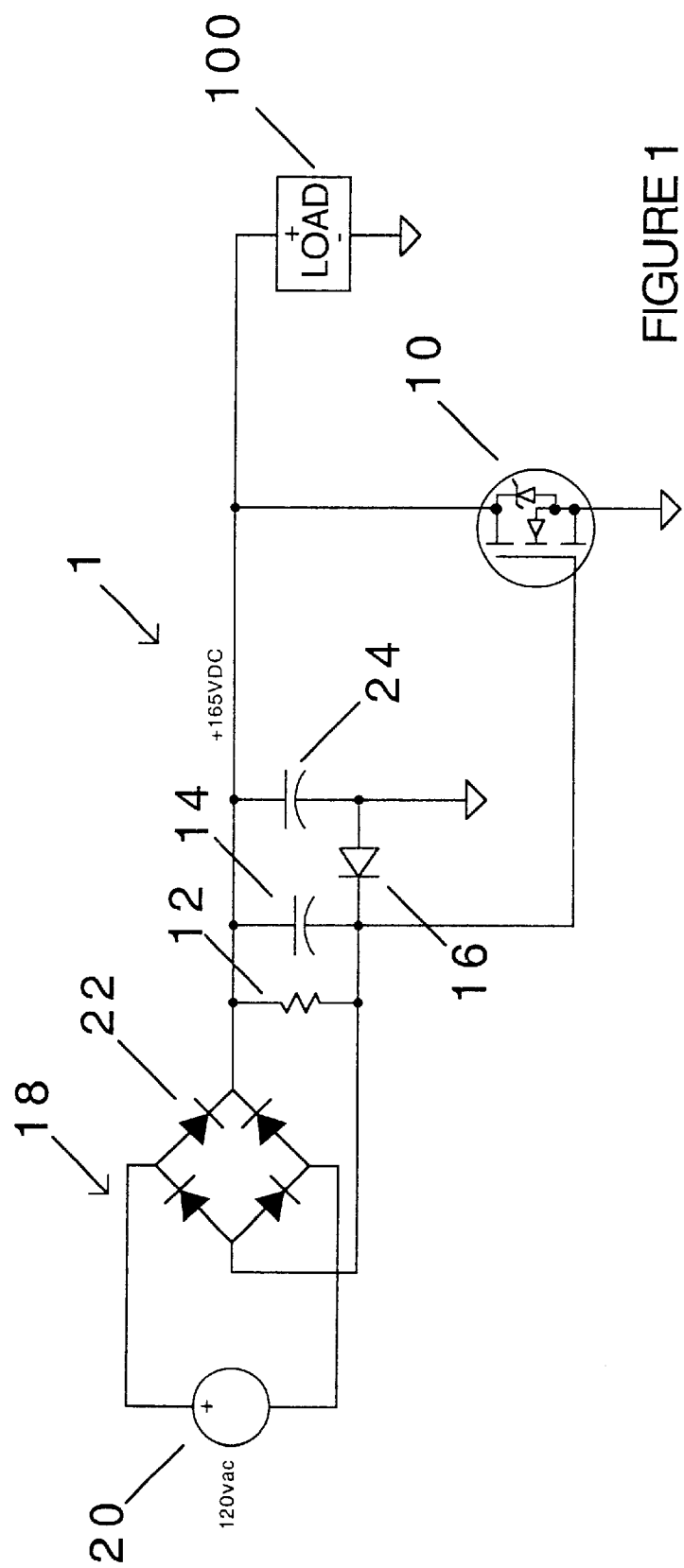
FIG. 1 is a schematic drawing of a DC voltage bus clamp in accordance with the present invention.

With reference now to the drawings, and particularly to FIG. 1, there is shown a schematic drawing of a DC voltage bus clamp 1. The DC voltage bus clamp 1 includes a transistor 10, a bleed resistor 12, and a pull-down diode 16. The transistor 10 is placed in parallel with a load 100. If the power source supplies AC voltage, a filter capacitor 14 is required. The bleed resistor 12 and the filter capacitor 14 are placed in parallel with each other. One end of the bleed resistor 12 is connected to a positive terminal of the load 100 and the other end of the bleed resistor is connected to a cathode of the pull-down diode 16. A gate or base of the transistor 10 is connected to the other end of the bleed resistor. The anode of the pull-down diode 16 is connected to ground and the cathode connected to the gate or base of the transistor 10. The DC power supply 18 includes a 120 AC voltage power source 20, the bridge rectifier circuit 22, and a smoothing capacitor 24.

The DC voltage bus clamp 1 is preferably used with the DC power supply 18, but could be used in other circuit topologies, such as a DC battery. The output of the DC power supply 18 is 165 volts DC. The load 100 is connected to the DC power supply 18. When the load 100 is slowed or stopped, electrical current is discharged from the load 100 and flows back to the DC power supply 18. The voltage across the smoothing capacitor 24 will exceed 165 volts DC and a small current will flow through the pull-down diode 16 and reverse bias the pull-down diode 16.

Figure 2:
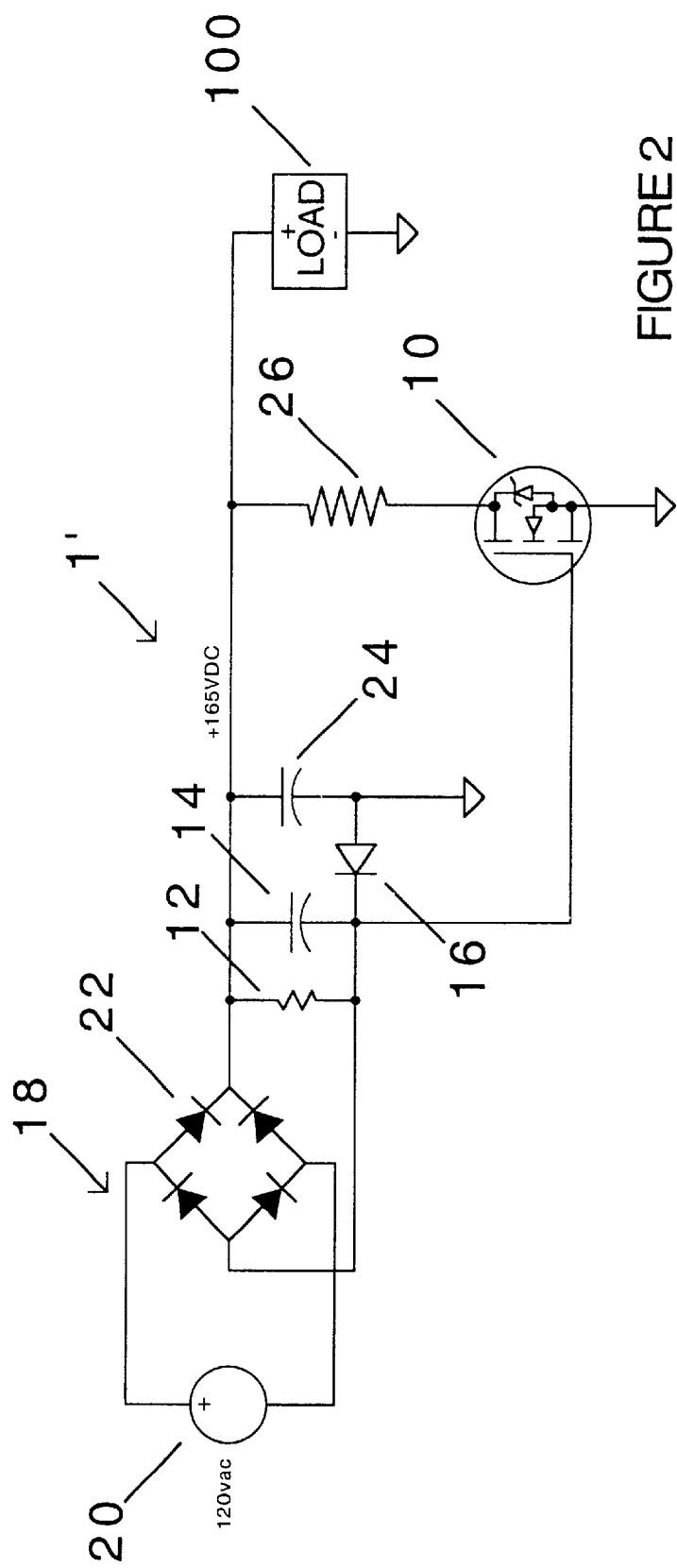
FIG. 2 is a schematic drawing of a DC voltage bus clamp with a power resistor in series with a transistor in accordance with the present invention.

The transistor 10 is preferably a IRF644 model which turns on when the gate voltage reaches 3 volts. However, other types of FETS or bipolar transistors may also be used. The voltage at the smoothing capacitor 24 never rises above positive 165 volts plus the turn on voltage of the transistor 10. The bleed resistor 12 supplies current to the gate of the transistor 10 and the filter capacitor 14 provides a time delay to the current supplied to the gate of the transistor 10. With reference to FIG. 2, a power resistor 26 is connected in series with the drain or collector of the transistor 10 to create a DC voltage bus clamp 1'. The power resistor 26 dissipates most of the heat from the reverse electrical current of the load 100 instead the transistor 10.

The DC voltage bus clamps 1, 1' have been found to work satisfactorily when the electrical components have the following values, the bleed resistor 12: 1 megaohm, the filter capacitor 14: 0.47 microfarads, the pull-down diode 16: 1N5404, and the power resistor: 150 ohms @ 10 watts. However, other values or types of components may also be used.

Figure 3:
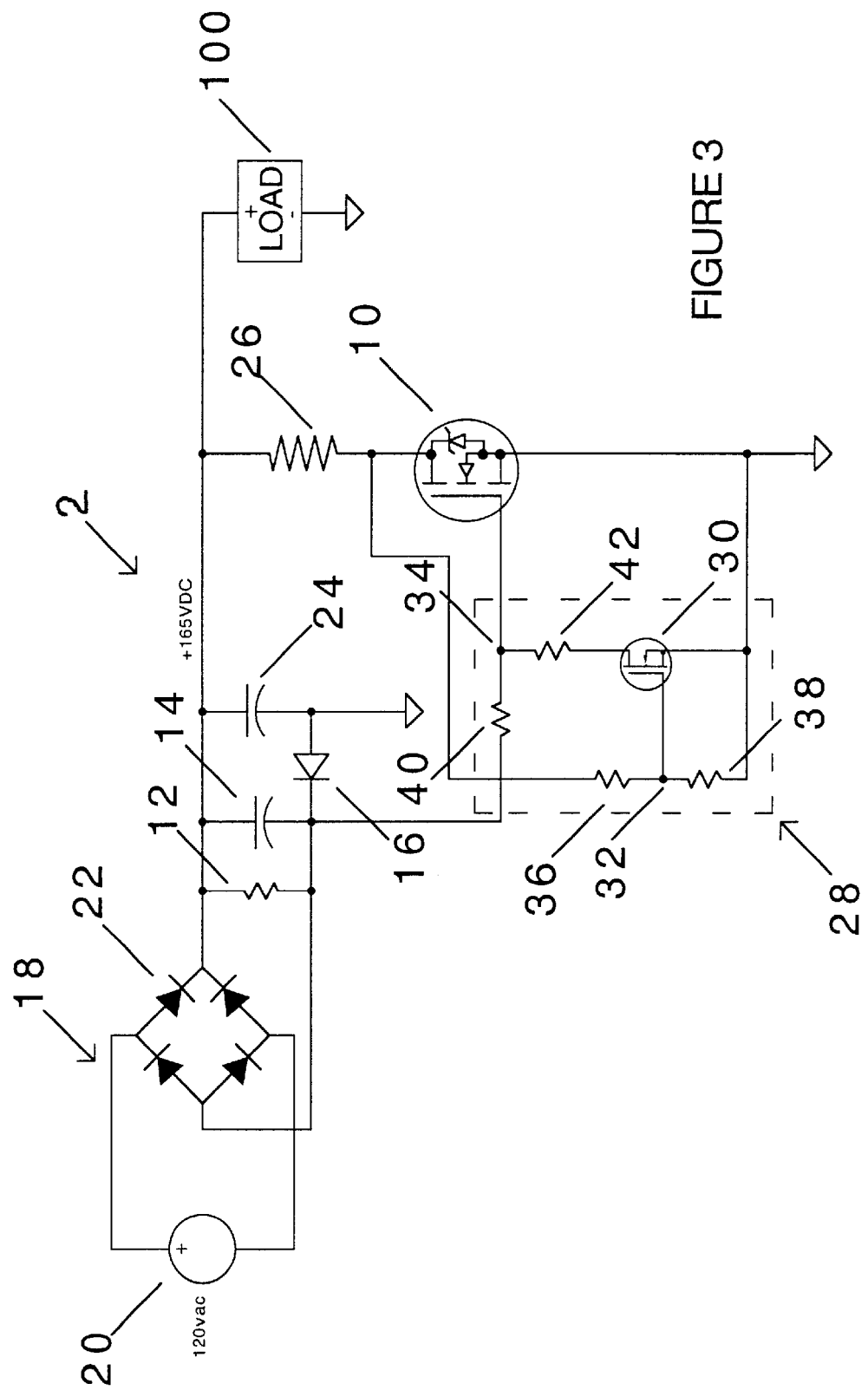
FIG. 3 is a schematic drawing of a second embodiment of a DC voltage bus clamp having a hysteresis circuit added to suddenly trigger a transistor in accordance with the present invention.

With reference to FIG. 3, a hysteresis circuit 28 is added to create a second embodiment of the DC voltage bus clamp 2 to trigger the transistor 10 suddenly. The hysteresis circuit 28 includes a pull-down transistor 30, bus voltage divider 32, and a gate voltage divider 34. The bus voltage divider 32 includes a first bus resistor 36 and a second bus resistor 38. The gate voltage divider 34 includes a first gate resistor 40 and a second gate resistor 42. One end of the first bus resistor 36 is connected to the junction of the power resistor 26 and the drain or collector of the transistor 10. The other end of the first bus resistor 36 is connected to the gate or base of the pull-down transistor 30. One end of the second bus resistor 38 is connected to the other end of the first bus resistor 36 and the other end of the second bus resistor 38 is grounded.

Figure 4:
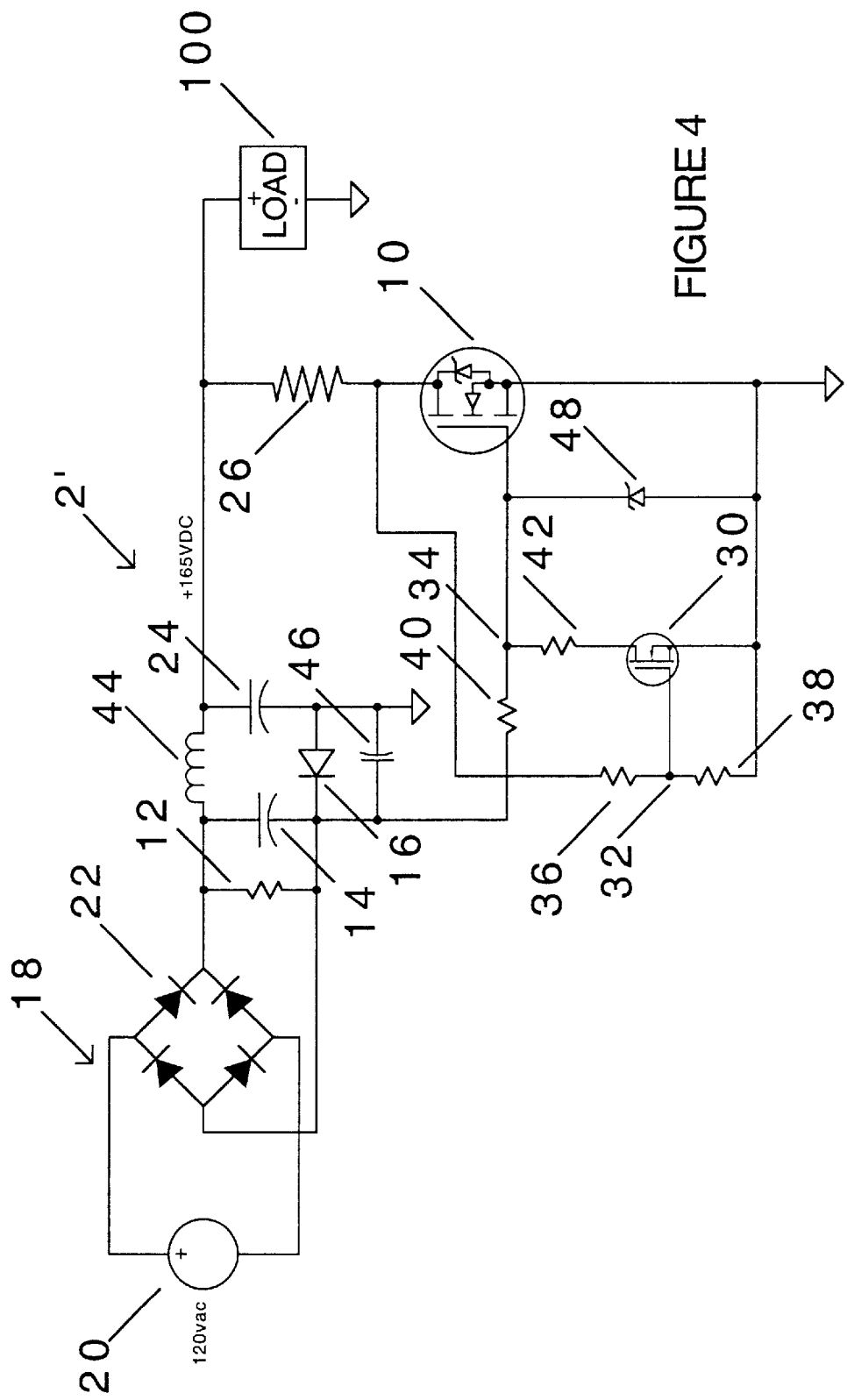
FIG. 4 is a schematic drawing of a second embodiment of a DC voltage bus clamp having filtering added to protect a power source from noise pulses in accordance with the present invention.

One end of the first gate resistor 40 is connected to the anode of the pull-down diode 16 and the other end is connected to the gate or base of the transistor 10. One end of the second gate resistor 42 is connected to the other end of the first gate resistor 40 and the other end of the second gate resistor 42 is connected to the pull-down transistor 30. The gate or base of the pull-down transistor 30 is supplied with reverse electrical current when the load 100 is turned-off. When the pull-down diode 16 is reversed biased, current flows to the gate of the transistor 10. The transistor 10 is turned on when the voltage across the pull-down diode 16 reaches the turn-on value of the transistor 10. The turn-on voltage of the transistor 10 in FIGS. 1 & 2 is 3 volts and the turn-on voltage of the transistor in FIGS. 3 & 4 is 6 volts. As the transistor 10 turns on, the voltage across the transistor 10 drops from about 165 volts to about 82 volts. The voltage across the second bus resistor 38 will reach the turn-off threshold of the pull-down transistor 30.

The second gate resistor 42 is effectively removed from the circuit when the pull-down transistor 30 is turned-off. The transistor 10 is fully turned-on when the pull-down transistor 30 is turned-off and the voltage across the transistor 10 drops to nearly zero. The turn-off threshold voltage across the pull-down diode 16 is changed from about 6 volts to about 3 volts, causing hysteresis. The pull-down transistor 30, bus voltage divider 32, and a gate voltage divider 34 may be replaced with a diac.

The hysteresis circuit 28 has been found to work satisfactorily when the electrical components have the following values, the first bus resistor 36: 200 kohms, the second bus resistor 38: 4.99 kohms, the first gate resistor 40: 100 kohms, the second gate resistor 42: 100 kohms, and the pull-down transistor 30: 2N7000. However, other values or types of components may also be used. The first bus resistor 36 is selected to minimize the peak power dissipation in the transistor 10 and thereof in a safe operating region.

With reference to FIG. 4, capacitive and inductive filtering is added to create a DC voltage bus clamp 2' to prevent noise pulses from being reflected back into the 120 AC voltage power source 20. The capacitive and inductive filtering has the added benefit of preventing false triggering of the transistor 10. An inductor 44 is connected in series between the bridge rectifier circuit 22 and the load 100. A second filter capacitor 46 is placed in parallel with the pull-down diode 16. The inductor 44 and second filter capacitor 46 filter motor control pulses across the load 100 and prevent reverse electrical current from getting to the 120 AC voltage power source 20. Preferably, a zener diode 48 is connected to the gate or base of the transistor 10 and to ground. The zener diode 48 prevents the gate or base of the transistor 10 from rising above 20 volts in the event of a component failure in the DC voltage bus 2' or DC power supply 18. The bleed resistor 12, the filter capacitor 14, and the second filter capacitor 46 establish bleed time so that the transistor 10 is not turned-on between 120 hertz line pulses.

The DC voltage bus clamp 2' has been found to work satisfactorily when the additional electrical components have the following values, the second filter capacitor 46: 0.001 microfarads and the zener diode 48: 1N5246B. However, other values or types of components may also be used.

Figure 5:
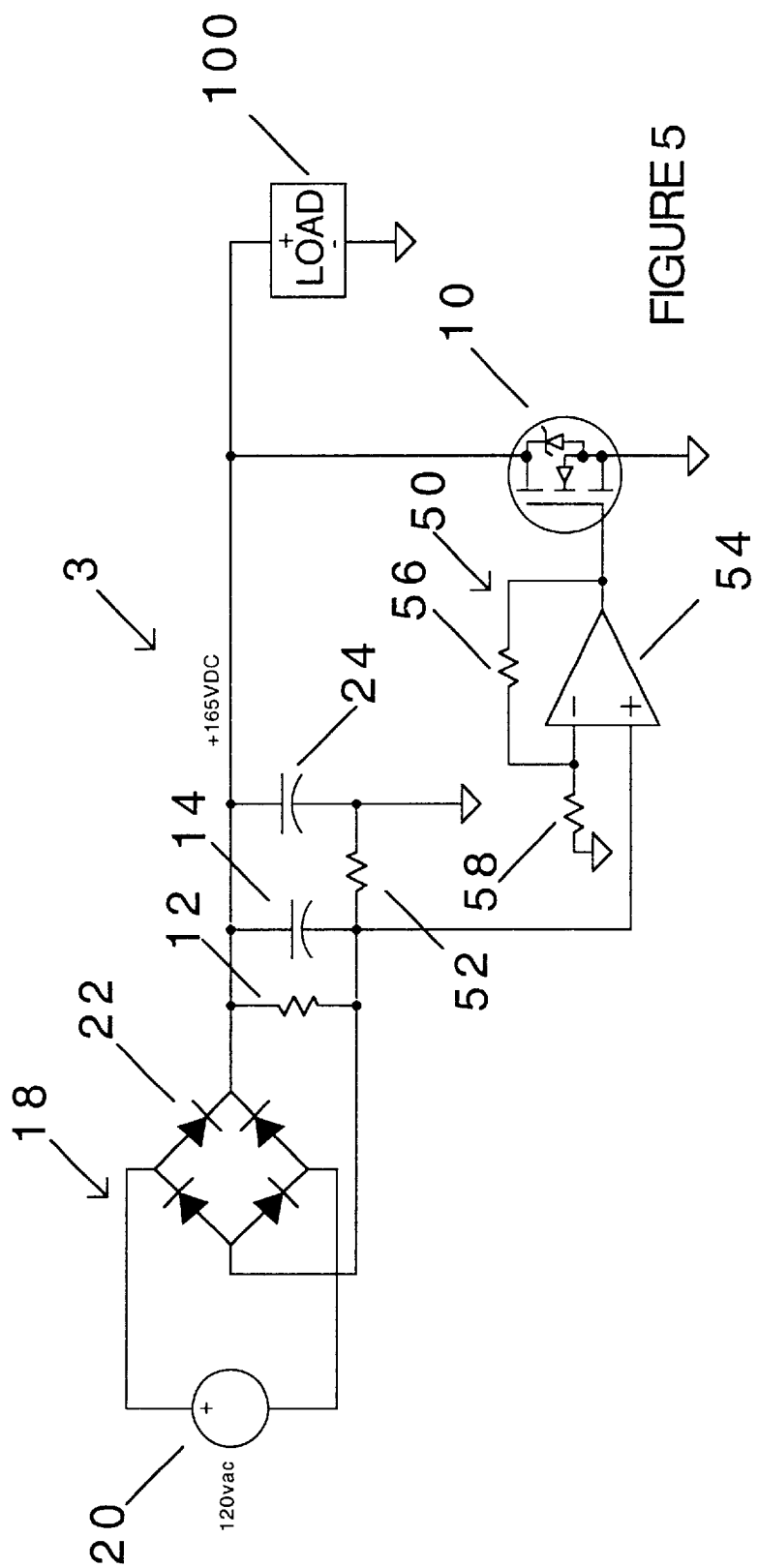
FIG. 5 is a schematic drawing of a third preferred embodiment of a DC voltage bus clamp in accordance with the present invention.

With reference to FIG. 5, a third embodiment of the DC voltage bus clamp 3 includes the transistor 10, the bleed resistor 12, a resistor sensing circuit 50, and a sense resistor 52. The transistor 10 is placed in parallel with the load 100. If the power source supplies AC voltage, the filter capacitor 14 is required. One end of the bleed resistor 12 is connected to a positive terminal of the load 100. One end of the sense resistor 52 is connected to ground and the other end is connected to the other end of the bleed resistor 12.

The resistor sensing circuit 50 is connected between the other end of the sense resistor 52 and the gate or base of the drain resistor 10. The resistor sensing circuit 50 includes an operational amplifier (op amp) 54 configured as a non-inverting amplifier. A gain resistor 56 is connected across the op amp 54. A negative terminal of the op amp 54 is coupled to ground through a grounding resistor 58. A positive terminal of the op amp 54 is connected to the other end of the sense resistor 52. The output of the op amp 54 is connected to the gate or base of the drain transistor 10.

A small current flows through the sense resistor 52 to create an input voltage at the positive terminal of the op amp 54. The input voltage is multiplied by the gain resistor 56 and divided by the ground resistor 58. The transistor 10 is turned-on, when the voltage output of the resistor sensing circuit 50 reaches the turn-on voltage of the transistor 10. The transistor 10 dissipates the reverse electrical current from the load 100. A power resistor 26 as shown FIG. 2 may be added in series with the transistor 10 to help dissipate the current discharged from the load 100.

The DC voltage bus clamp 3 has been found to work satisfactorily when the additional electrical components have the following values, the sense resistor 52: 1 ohm, the op amp 54: TLC2272IP, the gain resistor 56: 200 kohms, and the ground resistor 58: 10 kohms. However, other values or types of components may also be used.

Figure 6:
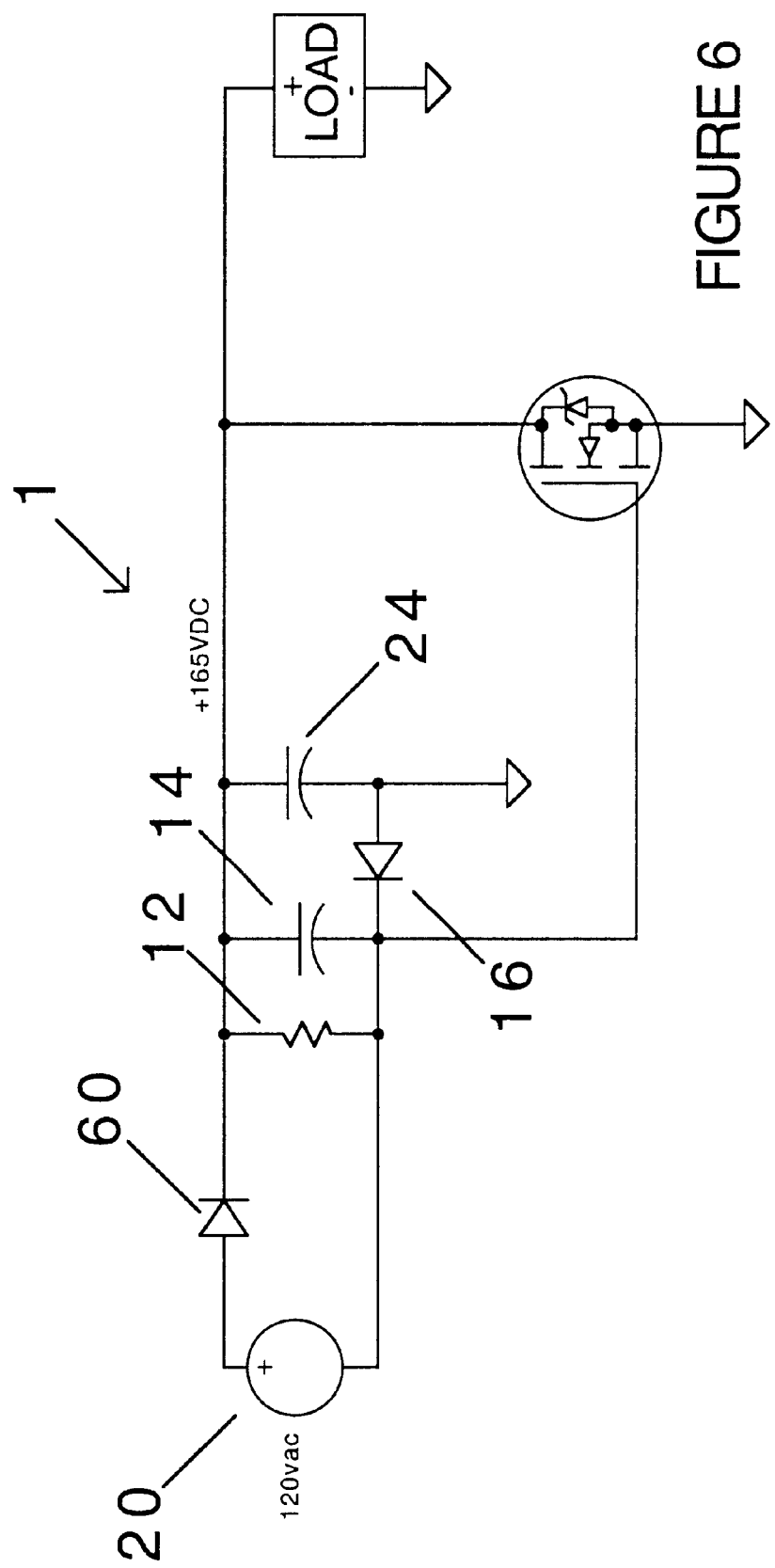
FIG. 6 is a schematic drawing of a DC voltage bus clamp with a single diode to rectify AC voltage in accordance with the present invention.

With reference to FIG. 6, the DC voltage bus clamp 1–3, may also be used with half wave rectification. The positive output of the 120 AC voltage source 20 is connected to a rectifying diode 60 instead of the full bridge rectifier 22. The bleed resistor 12 and the filter capacitor 14 are connected across the 120 AC voltage source 20. The gate or base of the transistor 10 is connected to a negative terminal of the 120 AC voltage source 20. A cathode of the rectifying diode 60 or the other end of the sense resistor 52 is connected to a negative terminal of the 120 AC voltage source 20.

The DC voltage bus clamp 1–3 has the unexpected benefit of discharging the smoothing capacitor 24 after a power supply is turned off. The 165 volts DC will leak through the bleed resistor 12 and turn on the gate or base of the transistor 10. Current from the smoothing capacitor 24 will drain through the transistor 10 until the voltage at the gate or base is below the turn-on voltage of the transistor 10.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

I claim:

1. A DC voltage bus clamp in combination with a load, comprising:

a transistor being connected across the load;

a resistor having one end connected to the load and the other end connected to a gate or base of said transistor; and a diode having an anode grounded and a cathode connected to the other end of said resistor;

wherein an input signal is connected across said resistor.

2. The DC voltage bus clamp in combination with a load of claim 1, further comprising:

a capacitor being connected in parallel with said resistor.

3. The DC voltage bus clamp in combination with a load of claim 1, further comprising:

a power resistor being connected in series between the load and said transistor.

4. The DC voltage bus clamp in combination with a load of claim 1, further comprising:

a hysteresis circuit being connected between the other end of said resistor and said gate or base of said transistor.

5. The DC voltage bus clamp in combination with a load of claim 4, further comprising:

said hysteresis circuit including a pull-down transistor for pulling down said gate or base of said transistor.

6. The DC voltage bus clamp in combination with a load of claim 1, further comprising:

an inductor being connected in series between a power source and the load.

7. A DC voltage bus clamp in combination with a load, comprising:

a transistor being connected across the load;

a resistor having one end connected to the load and the other end connected to a gate or base of said transistor;

a sense resistor having one end grounded and the other end connected to other end of said resistor; and a non-inverting amplifier being connected in series between the other end of said sense resistor and said gate or base of said transistor;

wherein an input signal is connected across said resistor.

8. The DC voltage bus clamp in combination with a load of claim 7, further comprising:

a capacitor being connected in parallel with said resistor.

9. The DC voltage bus clamp in combination with a load of claim 7, further comprising:

a power resistor being connected in series between the load and said transistor.

10. A method of protecting a power supply from reverse current from a load, comprising the steps of:

connecting an input signal across a resistor;

connecting a transistor across the load;

connecting one end of said resistor to the load and the other end to a gate or base of said transistor; and grounding one end of a diode and connecting the other end to the other end of said resistor.

11. The method of protecting a power supply from reverse current from a load of claim 10, further comprising the step of:

connecting a capacitor in parallel with said resistor.

12. The method of protecting a power supply from reverse current from a load of claim 10, further comprising the step of:

connecting a power resistor in series between the load and said transistor.

13. The method of protecting a power supply from reverse current from a load of claim 10, further comprising the step of:

connecting a hysteresis circuit in series between the other end of said resistor and said gate or base of said transistor.

14. The method of protecting a power supply from reverse current from a load of claim 13, further comprising the step of:

including a pull-down transistor for pulling down said gate or base of said transistor in said hysteresis circuit.

15. The method of protecting a power supply from reverse current from a load of claim 10, further comprising the step of:

connecting an inductor in series between a power source and the load.

16. A method of protecting a power supply from reverse current from a load, comprising the steps of:

connecting an input signal across a resistor;

connecting a transistor across the load;

connecting one end of said resistor to the load and the other end to a gate or base of said transistor;

grounding one end of a sense resistor and connecting the other end connected to the other end of said resistor; and connecting a non-inverting amplifier in series between the other end of said sense resistor and said gate or base of said transistor.

17. The method of protecting a power supply from reverse current from a load of claim 16, further comprising the step of:

connecting a capacitor in parallel with said resistor.

18. The method of protecting a power supply from reverse current from a load of claim 16, further comprising the step of:

connecting a power resistor in series between the load and said transistor.

* * * * *